US012733454B2

(12) United States Patent
Wang et al.

(10) Patent No.: US 12,733,454 B2

(45) Date of Patent: Sep. 8, 2026

(54) METHOD FOR DETECTING BACK SURFACE OF WAFER

(71) Applicant: United Semiconductor (Xiamen) Co., Ltd., Xiamen (CN)

(72) Inventors: Chen Feng Wang, Shamen City (CN); Ching-Shu Lo, Singapore (SG); Tsung Che Lin, Singapore (SG); Sen-Chih Chang, Tainan City (TW); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 809 days.

(21) Appl. No.: 17/903,050

(22) Filed: Sep. 6, 2022

(65) Prior Publication Data

US 2024/0047278 A1 Feb. 8, 2024

(30) Foreign Application Priority Data

Aug. 2, 2022 (CN) ......................... 202210920872.4

(51) Int. Cl.

*H10P 74/20* (2026.01)
*G06T 7/00* (2017.01)

(52) U.S. Cl.

CPC .......... *H10P 74/203* (2026.01); *G06T 7/0004* (2013.01); *G06T 7/001* (2013.01); *H10P 74/20* (2026.01); *G06T 2207/30148* (2013.01); *G06T 2207/30168* (2013.01)

(58) Field of Classification Search

CPC ....... H01L 22/12; G06T 7/001; G06T 7/0004; G06T 2207/30148; G06T 2207/30168

See application file for complete search history.

(56) References Cited

U.S. PATENT DOCUMENTS 6,724,476 B1 * 4/2004 Phan .................. G01N 21/9501 356/237.4
2014/0227807 A1 * 8/2014 Nakajima ......... H01L 21/67288 355/72

FOREIGN PATENT DOCUMENTS

| | | | | |
|---|---|---|---|---|
| CN | 103295930 A | | 9/2013 | |
| CN | 113032416 A | | 6/2021 | |
| CN | 114140425 A | * | 3/2022 | ......... G01N 21/8851 |
| CN | 114171375 A | | 3/2022 | |
| CN | 114372969 A | | 4/2022 | |
| JP | 10-135287 A | | 5/1998 | |

* cited by examiner

*Primary Examiner* — Peter K Huntsinger
(74) *Attorney, Agent, or Firm* — Winston Hsu

(57) ABSTRACT

The invention provides a method for detecting the back surface of a wafer, which comprises providing a wafer and performing a detection step on the back surface of the wafer, wherein the detection step comprises capturing a gray scale map of the back surface of the wafer, finding out at least one defect of the back surface of the wafer according to a deviation of the gray scale map, and transmitting the data of the at least one defect back to a system, and the system performs a judgment step according to the data of the at least one defect.

8 Claims, 2 Drawing Sheets

METHOD FOR DETECTING BACK SURFACE OF WAFER

BACKGROUND OF THE INVENTION

1. Field of the Invention

The present invention relates to the field of semiconductor manufacturing process, in particular to a method for detecting the back surface of a wafer in the semiconductor manufacturing process.

2. Description of the Prior Art

In the semiconductor manufacturing process, electronic components are usually fabricated on one side of the wafer (called front surface here), while the other side opposite to the front surface (called back surface) may remain blank. Therefore, in the prior art, the quality requirements for the back surface of the wafer are low, and the back surface of the wafer is usually not inspected excessively.

However, with the development of technology, some products will form electronic components on the front surface and the back surface of the wafer at the same time, or when the thickness of the wafer is reduced to less than the usual thickness by the planarization step, the quality requirements for the back surface of the wafer are gradually improved. According to the current technology, the active inspection of the back surface of the wafer is usually done manually, but this method takes a lot of time, which is not conducive to the productivity of the product.

SUMMARY OF THE INVENTION

The invention provides a method for detecting the back of a wafer, which comprises providing a wafer and performing a detection step on the back surface of the wafer, wherein the detection step comprises: capturing a gray scale map of the back surface of the wafer, finding out at least one defect of the back surface of the wafer according to a gray scale deviation of the gray scale map, and transmitting a plurality of data of the at least one defect back to a system, and the system performing a judgment step according to the data of the at least one defect.

The invention is characterized in that, compared with the prior art, which detect the back surface of the wafer manually, the invention detects the back surface of the wafer in the same machine in an automatic way during the manufacturing process. In addition, the invention can also judge whether there is a need for adjustment in the manufacturing process (for example, adjusting the angle of wafer feeding into the machine, the rotating speed of the wafer, etc.) according to the collected parameters such as defect types, shapes, sizes and directions, so as to improve the efficiency and yield of the manufacturing process.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to users skilled in the technology of the present invention, preferred embodiments are detailed as follows. The preferred embodiments of the present invention are illustrated in the accompanying drawings with numbered elements to clarify the contents and the effects to be achieved.

Please note that the figures are only for illustration and the figures may not be to scale. The scale may be further modified according to different design considerations. When referring to the words "up" or "down" that describe the relationship between components in the text, it is well known in the art and should be clearly understood that these words refer to relative positions that can be inverted to obtain a similar structure, and these structures should therefore not be precluded from the scope of the claims in the present invention.

Figure 1:
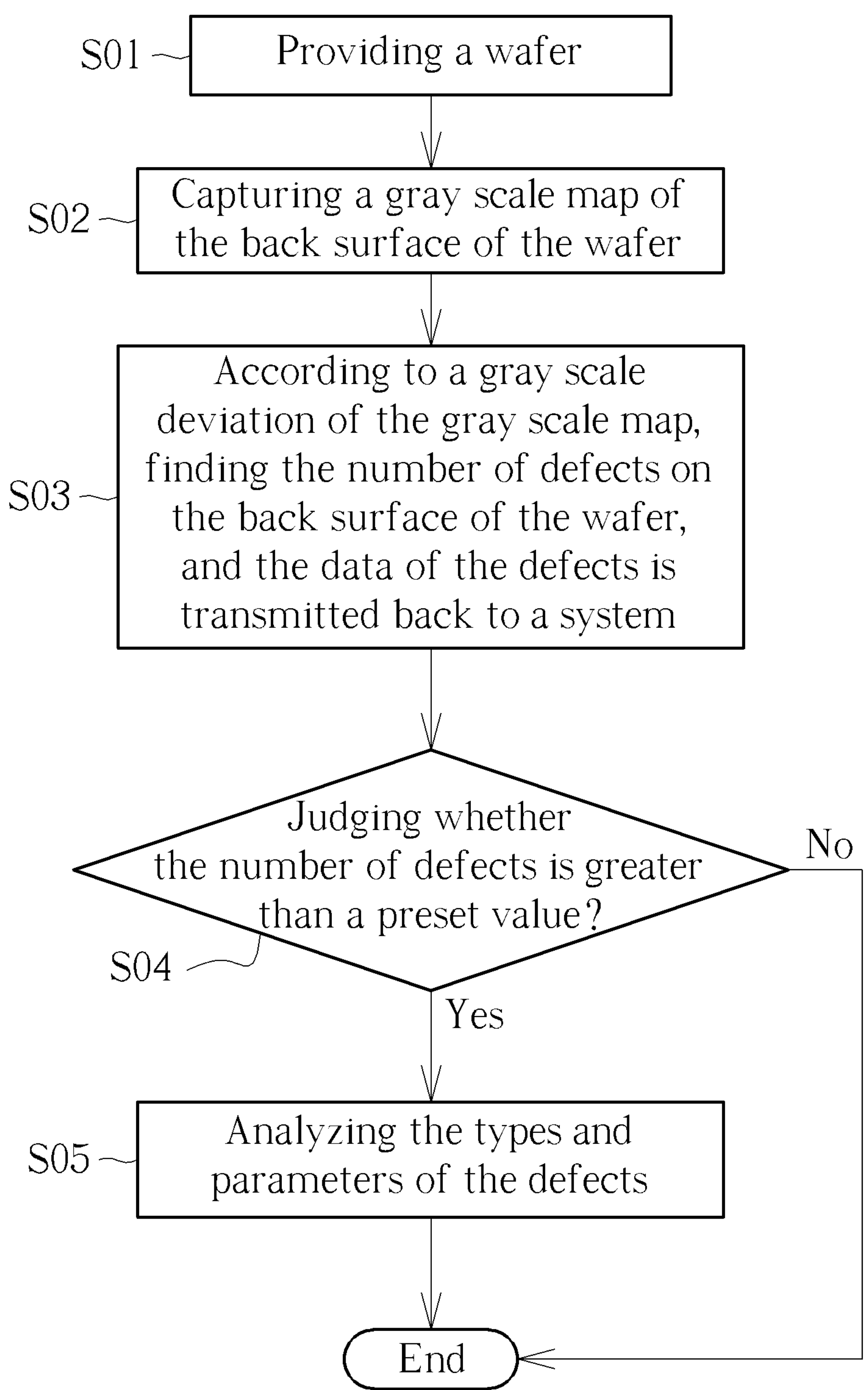
FIG. 1 is a flowchart of the method for detecting the back surface of a wafer provided by the present invention.
Figure 2:
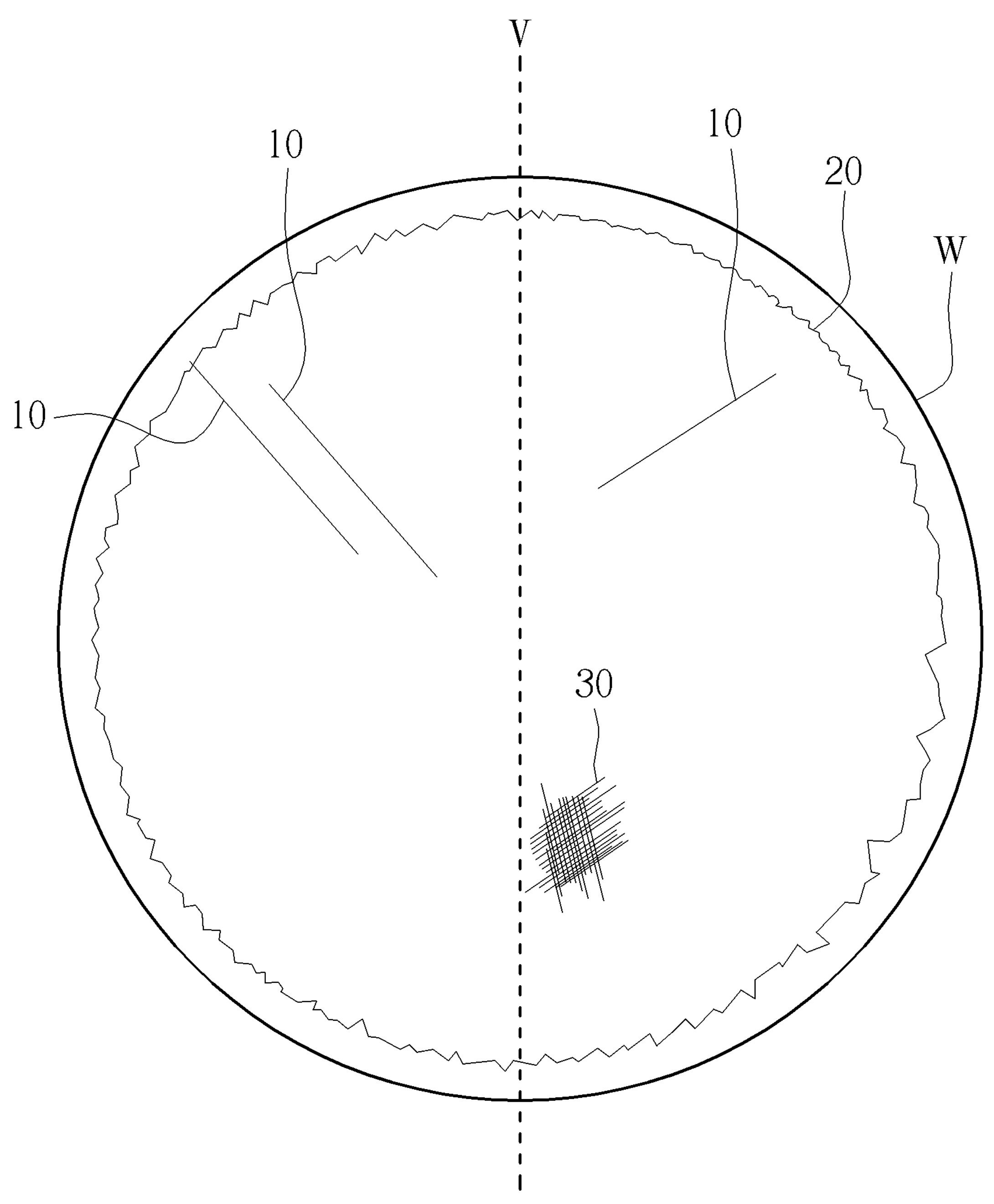
FIG. 2 is a schematic diagram of defects on the back surface of a wafer.

FIG. 1 is a flowchart of the method for detecting the back surface of a wafer provided by the present invention, and FIG. 2 is a schematic diagram of defects on the back surface of a wafer. As shown in FIG. 1, at first, as shown in step S01, a wafer W is provided, which has a front surface and a back surface, in which various electronic components are usually formed on the front surface in a general semiconductor process. Compared with the front surface, the back surface of the wafer W may have no electronic components or only a small number of electronic components.

With the development of semiconductor technology, some electronic components will be formed on the back surface of the wafer, or in order to reduce the total thickness of semiconductor components, planarization steps (such as chemical mechanical polishing) will be used to reduce the thickness of the wafer from the back surface of the wafer. Therefore, the quality requirements of the back surface of the wafer are also improved. Generally speaking, the back surface of the wafer may have various defects during the manufacturing process. FIG. 2 also shows the types of defects that may occur on the back surface of the wafer W. As shown in FIG. 2, the back surface of the wafer W contains various defects, such as strip defects 10, circular defects 20 and bruised scars 30. It should be noted that the above-mentioned various defects may not exist on the back surface of the same wafer W at the same time, but one or several defects may exist on the back surface of the wafer, which is also within the scope of the present invention.

In the conventional technology, before the semiconductor process starts, that is, before the electronic components are formed on the front surface of the wafer, the back surface of the wafer can be inspected manually. In addition, when the semiconductor process goes to a stage (for example, when the wafer is taken out of the machine after a specific material layer is finished), the process can also be suspended and the back surface of the wafer can be checked manually again. However, the above-mentioned method of inspecting the back surface of the wafer by manpower still has some disadvantages. Firstly, the process must be interrupted, which will obviously reduce the efficiency of the process. Secondly, manpower does not have an accurate criterion for judging the defects on the back surface of the wafer. For example, manpower can roughly tell the number of defects on the back surface of the wafer, but the characteristics of other defects, such as the angle, distribution, length and depth of the defects, cannot be accurately judged. If the data of the above defects need to be measured manually, further measurement is needed, which will reduce the efficiency of the process again.

Therefore, in order to solve the above problems, the present invention provides a method for detecting the back surface of a wafer in an automatic way instead of manpower. The concept of the present invention is to automatically replace the manpower to detect the back surface of the wafer before the semiconductor process is carried out or when the semiconductor process is in a pause stage. In order to achieve the purpose of automation and saving steps, it is preferable that the detection process of the present invention can be the same as the machine used in the semiconductor manufacturing process, so that the detection steps can be performed more efficiently. As shown in FIG. 1, after step S01 (providing a wafer W), step S02 is performed to capture a gray scale map of the back surface of the wafer. In this embodiment, a camera and other devices are used to capture the image of the back surface of the wafer in a machine used in the semiconductor process, and then the image is converted into a gray scale map. According to a gray scale table, the gray scale map described here can classify all parts of the image according to the degree of light and dark (gray scale). The present invention does not limit the number of gray scales of the gray scale table, for example, the more common gray scale table of 256 scales or the gray scale table of 512 scales can be applied to the present invention, and can also be adjusted according to requirements, but the present invention is not limited to this.

Next, step S03 is performed: according to a gray scale deviation of the gray scale map, the number of defects on the back surface of the wafer is found, and the data of the defects is sent back to a system. When the captured image on the back surface of the wafer is converted into a gray scale map, similar areas usually have similar gray scales. If it is found that some areas have obvious gray scale deviation from other adjacent areas, it means that the position on the back surface of the wafer has obvious height change, and then it may be judged that there is a defect (such as scratch, etc.). Because the back surface of the wafer is usually a smooth surface, only a small height change is needed to change the gray scale map. It is worth noting that the present invention can be set by the system to determine that there is a defect when the gray scale difference is greater than a critical value, and this critical value can be adjusted according to the actual situation of the back surface of the wafer. For example, the back surface of some wafers is smooth, so only a small amount of gray scale deviation can reflect the existence of defects. At this time, the critical value can be set smaller (for example, less than 10 scales of gray scale, but not limited to this). However, some wafers have patterns or uneven surfaces on the back, so it is necessary to increase the critical value (threshold value) of gray scale deviation set here (for example, it is greater than 10 scales of gray scale, but not limited to this), which can better reflect the actual number of defects and avoid misjudging the number of defects. Here, the critical value can be adjusted according to actual requirements, and the present invention is not limited by this.

As shown in step S04, it is determined whether the number of defects is greater than a preset value. Here, the preset value of can be 0 or other integers, which means that when the calculated number of defects is less than the preset value (default value), the system can allow the semiconductor process to continue with the subsequent steps. On the other hand, if the number of defects is greater than the preset value, it means that the system determines that the number of defects is too large to affect the yield of the semiconductor process. At this time, the defect analysis step will be carried out before performing the next semiconductor process. In this embodiment, the preset value is set to 0, which means that as long as the system detects any defect, the next defect analysis step will be performed.

The above-mentioned step S04 belongs to a step of preliminarily judging the number of defects. When the number of defects is greater than the preset value (for example, 0 in this embodiment), step S05 is performed to analyze the types and various parameters of defects. Referring to FIG. 2 together, in this embodiment, defects can be divided into a plurality of categories, such as strip defects (or scratches) 10, circular defects 20 and bruised scars 30. The strip defect 10 presents a long strip shape, which is usually caused by the incorrect angle when the wafer is fed into the machine. The data of the strip defect 10 analyzed in the present invention includes the length of strip defects, the number of strip defects, the included angle with a vertical line V, etc. The circular defect 20 is an annular mark generated near the boundary of the wafer, usually accompanied by the spin coating process of the wafer. The data of the circular defect 20 analyzed in the present invention includes the number, radius, perimeter, etc. of the circular defect 20. The bruised scar 30 is a scratch area similar to a block (different from the line shape of the strip defect 10). The data of the bruised scar 30 analyzed in the invention includes: number, distribution position, area, etc. In addition, besides the various data analyzed above, it can also include other data analysis, such as the shortest distance from the extension line of the strip defect to the center of the wafer, or other data that can be obtained according to the defect, all of which belong to the scope of the present invention.

After obtaining the above defect data, the system can determine whether the semiconductor process steps need to be corrected according to the obtained various defect data. For example, from the number, position, angle and distribution area of defects, the possible time points of these defects can be further obtained, that is to say, it can be determined which semiconductor process step these defects are generated. For example, the length and angle of a strip defect 10 can be used to determine that the wafer may produce the strip defect when it is sent to the machine in a certain step. For example, other circular defects 20 or bruised scars 30 can also get various feedback data by similar methods, so research staff can adjust the process parameters to avoid these defects.

Finally, after the above analysis of the types of defects and various parameters is completed, research staff can choose whether to continue the subsequent semiconductor process on the wafer. This partly depends on whether the defects on the back surface of the wafer exceed the allowable values set by the system. Usually, if the number, length, size and other characteristics of defects are within the allowable range, the subsequent semiconductor process will continue; otherwise, the wafer may be discarded. This part belongs to the conventional technology in the field, so it will not be repeated here.

According to the above description and drawings, the present invention provides a method for inspecting the back surface of a wafer, which includes providing a wafer W (step S01), and detecting a back surface of the wafer W, wherein the detection step includes capturing a gray scale map of the back surface of the wafer (step S02), finding out the number of defects on the back surface of the wafer according to a gray scale deviation of the gray scale map, and returning the defect data to a system (step S03), and the system performs a judgment step according to at least one defect data (step S03)

In some embodiments of the present invention, the wafer further comprises a front surface, wherein the method further comprises performing a first semiconductor process on the front surface of the wafer, and then performing the detection step on the back surface of the wafer, and performing a second semiconductor process on the front surface of the wafer, and then the detection step is performed on the back surface of the wafer again. That is, the detection method of the present invention may be repeatedly performed in the semiconductor manufacturing process.

In some embodiments of the present invention, the detection step is performed in the same machine as the first semiconductor process and the second semiconductor process.

In some embodiments of the present invention, it is further included that performing the detection step on the back surface of the wafer before the first semiconductor process is performed.

In some embodiments of the present invention, the defects include a strip defects 10, circular defects 20 and a bruise scars 30.

In some embodiments of the present invention, the plurality of data of the defect comprise the total number of defects, the maximum length of the strip defect, the angle between the strip defect and a vertical line, the circumference of the circular defect and the area of the bruised scar.

In some embodiments of the present invention, the judgment step comprises: according to the data of the at least one defect, a process node producing the at least one defect is determined. That is to say, according to the defect data, it can be determined at which step the defect was generated.

In some embodiments of the present invention, if the total number of defects exceeds a preset value (step S04), a correction step (step of adjusting process parameters after step S05) is performed.

In some embodiments of the present invention, if the total number of defects does not exceed a preset value, a subsequent process is performed on the wafer without the correction step.

In some embodiments of the present invention, the method of capturing a gray scale map of the back surface of the wafer includes taking a picture of the back surface of the wafer to obtain a color image, and converting the color image into a gray scale map.

In some embodiments of the present invention, a range is selected in the grayscale image, and if the grayscale deviation in the range exceeds a critical value, it is determined that the range contains at least one defect.

The invention is characterized in that, compared with the prior art, which detect the back surface of the wafer manually, the invention detects the back surface of the wafer in the same machine in an automatic way during the manufacturing process. In addition, the invention can also judge whether there is a need for adjustment in the manufacturing process (for example, adjusting the angle of wafer feeding into the machine, the rotating speed of the wafer, etc.) according to the collected parameters such as defect types, shapes, sizes and directions, so as to improve the efficiency and yield of the manufacturing process.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for detecting the back surface of a wafer, comprising:

providing a wafer, the wafer comprises a front surface and a back surface;

performing a plurality of semiconductor processes on the front surface of the wafer, wherein a first one of the plurality of semiconductor processes is defined as a first semiconductor process which is an initial process performed prior to any other one of the plurality of semiconductor processes;

performing a detection step on the back surface of the wafer before the first semiconductor process is performed, wherein the detection step comprises:

capturing a gray scale map of the back surface of the wafer;

according to a gray scale deviation of the gray scale map, finding out at least one defect on the back surface of the wafer, and transmitting a plurality of data of the at least one defect back to a system, wherein the at least one defect includes a strip defect, a circular defect and a bruised scar, and the plurality of data of the at least one defect comprise the total number of defects, the maximum length of the strip defect, the angle between the strip defect and a vertical line, the circumference of the circular defect and the area of the bruised scar; and the system performs a judgment step according to the data of the at least one defect;

adjusting a plurality of process parameters of the first semiconductor process; and performing the first semiconductor process on the front surface of the wafer again.

2. The method for detecting the back surface of a wafer according to claim 1, wherein the method further comprising:

performing a second semiconductor process on the front surface of the wafer, and then the detection step is performed on the back surface of the wafer again.

3. The method for detecting the back surface of a wafer according to claim 2, wherein the detection step is performed in a same machine as the first semiconductor process and the second semiconductor process.

4. The method for detecting the back surface of a wafer according to claim 1, wherein the judgment step comprises:

according to the data of the at least one defect, a process node producing the at least one defect is determined.

5. The method for detecting the back surface of a wafer according to claim 1, wherein the method further comprises:

performing a correction step while the total number of defects is greater than a preset value.

6. The method for detecting the back surface of a wafer according to claim 5, wherein the method further comprising:

performing a subsequent process while the total number of defects does not exceed a preset value, and the correction step is not performed.

7. The method for detecting the back surface of a wafer according to claim 1, wherein the method for capturing a gray scale map of the back surface of the wafer comprises:

photographing the back surface of the wafer to obtain a color image;

converting the color image into the gray scale map.

8. The method for detecting the back surface of a wafer according to claim 1, wherein a range is selected in the gray scale map, and if the gray scale deviation in the range exceeds a critical value, it is determined that the range contains at least one defect.

* * * * *